(12) United States Patent
Tsukada et al.

(10) Patent No.: US 8,441,806 B2
(45) Date of Patent: May 14, 2013

(54) CIRCUIT BOARD AND SEMICONDUCTOR MODULE

(75) Inventors: Kiyotaka Tsukada, Gifu (JP); Tetsuya Muraki, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 203 days.

(21) Appl. No.: 12/894,968

(22) Filed: Sep. 30, 2010

(65) Prior Publication Data

US 2011/0080714 A1 Apr. 7, 2011

(30) Foreign Application Priority Data

Oct. 6, 2009 (JP) ................................. 2009-232566

(51) Int. Cl.
*H01R 9/00* (2006.01)
(52) U.S. Cl.
USPC .......................................... 361/774; 174/258
(58) Field of Classification Search .................. 174/257, 174/258, 261, 262; 257/728, 177, 727; 361/760, 361/774, 790
See application file for complete search history.

(56) References Cited

U.S. PATENT DOCUMENTS

| | | | |
|---|---|---|---|
| 4,547,834 A * | 10/1985 | Dumont et al. | 361/722 |
| 6,359,331 B1 | 3/2002 | Rinehart et al. | |
| 7,030,317 B1 | 4/2006 | Oman | |
| 2002/0140089 A1 * | 10/2002 | Mimino et al. | 257/728 |
| 2003/0174477 A1 | 9/2003 | Ohtani et al. | |
| 2007/0040186 A1 * | 2/2007 | Fillion et al. | 257/177 |
| 2007/0215999 A1 | 9/2007 | Kashimoto et al. | |
| 2008/0054439 A1 | 3/2008 | Malhan et al. | |
| 2009/0120677 A1 * | 5/2009 | Nomura et al. | 174/262 |
| 2011/0254177 A1 | 10/2011 | Malhan et al. | |

FOREIGN PATENT DOCUMENTS

| | | |
|---|---|---|
| DE | 10 2006 051 454 A1 | 9/2007 |
| JP | 2004-228403 | 8/2004 |
| JP | 2006-237429 | 9/2006 |

* cited by examiner

*Primary Examiner* — Yuriy Semenenko
(74) *Attorney, Agent, or Firm* — Oblon, Spivak, McClelland, Maier & Neustadt, L.L.P.

(57) ABSTRACT

A circuit board comprises a first conductive post for electrically connecting to the first electrode of the semiconductor device, a first metal plate connecting to the first conductive post, a second conductive post for electrically connecting to the second electrode of the semiconductor device, a second metal plate connecting to the second conductive post, a third conductive post for electrically connecting to the third electrode of the semiconductor device, and a third metal plate connecting to the third conductive post.

33 Claims, 19 Drawing Sheets

CIRCUIT BOARD AND SEMICONDUCTOR MODULE

CROSS-REFERENCE TO RELATED APPLICATION

This application claims the benefit of Japanese Patent Application No. 2009-232566, filed Oct. 6, 2009, the entire disclosure of which is incorporated by reference herein.

FIELD

This application relates generally to a circuit board and a semiconductor module.

BACKGROUND

When mounting IGBT (insulated-gate bipolar transistors) and other semiconductor devices used in high-current, high-voltage operating environments, durability against repeated heat cycles and high heat radiation properties are necessary in addition to maintaining component stability.

For example, in Unexamined Japanese Patent Application KOKAI Publication No. 2006-237429, a semiconductor module is disclosed that has a conductive post to enhance heat radiation. This semiconductor module has an insulated substrate (support substrate) having a plurality of through holes, conductive posts (copper pins) positioned on the through holes of the insulated substrate and a semiconductor device mounted on the insulator substrate. Furthermore, the conductive posts and the electrodes of the semiconductor device are electrically connected.

The contents of the disclosure of Unexamined Japanese Patent Application KOKAI Publication No. 2006-237429 are included in this specification.

SUMMARY

Means of Resolving Problem

The circuit board according to the present invention is a circuit board for mounting a semiconductor device having at least a first electrode, a second electrode and a third electrode, and has a first conductive post for electrically connecting to the first electrode of the semiconductor device, a first metal plate connecting to the first conductive post, a second conductive post for electrically connecting to the second electrode of the semiconductor device, a second metal plate connecting to the second conductive post, a third conductive post for electrically connecting to the third electrode of the semiconductor device and a third metal plate connecting to the third conductive post.

The semiconductor module according to the present invention has the above-described circuit board and a semiconductor device having at least a first electrode, a second electrode and a third electrode, wherein at least one out of the first through third metal plates is positioned so as to face the semiconductor device and is electrically connected to the semiconductor device via at least one of the first through third conductive posts.

BRIEF DESCRIPTION OF THE DRAWINGS

A more complete understanding of this application can be obtained when the following detailed description is considered in conjunction with the following drawings, in which.

DETAILED DESCRIPTION

Preferred Embodiment of the Present Invention

With conventional technology, when a high load is imposed on a semiconductor device, the problems exist that heat capacity is low in the insulating support substrate, heat resistance tends to be high, it is difficult to adequately eliminate the high-temperature heat generated by the semiconductor device and it is easy for the semiconductor device to be damaged or operate abnormally. Furthermore, because of the positioning of the insulating support substrate and conductive posts, warping caused by differences in the thermal expansion coefficients of the support substrate and the conductive posts and repeated reactions from the thermal expansion difference readily occur, so long-term electrical connection reliability tends to be low due to effects such as cracks readily occurring in the joint between the support substrate and the conductive posts.

The preferred embodiment of the present invention can provide a circuit board and a semiconductor module capable of high heat radiation and long-term reliability.

The circuit board and semiconductor module according to the preferred embodiment of the present invention are described below with reference to the drawings.

Figure 1A:
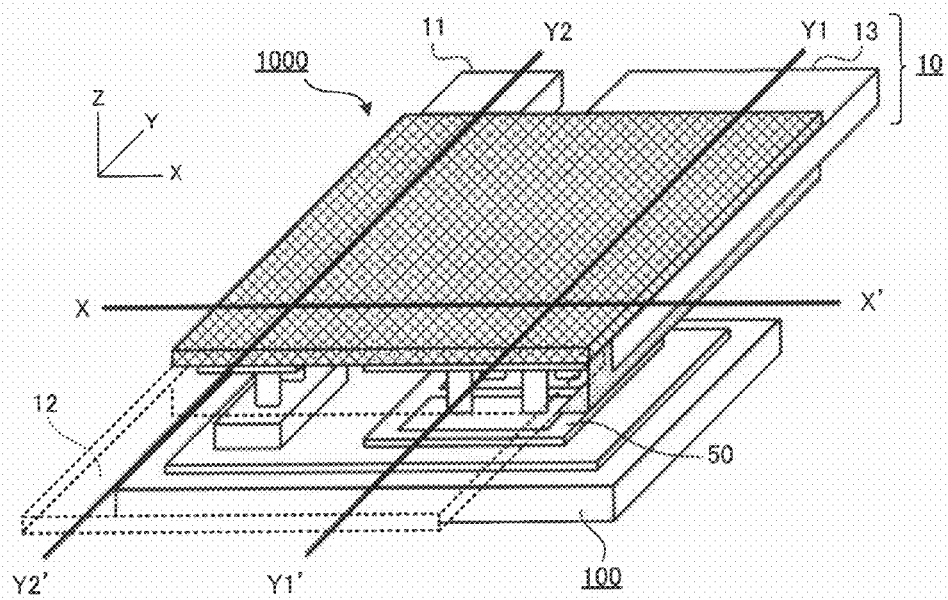
FIG. 1A shows a semiconductor module according to an embodiment of the present invention.

FIG. 1A shows a semiconductor module 1000 according to the present embodiment.

Figure 1B:
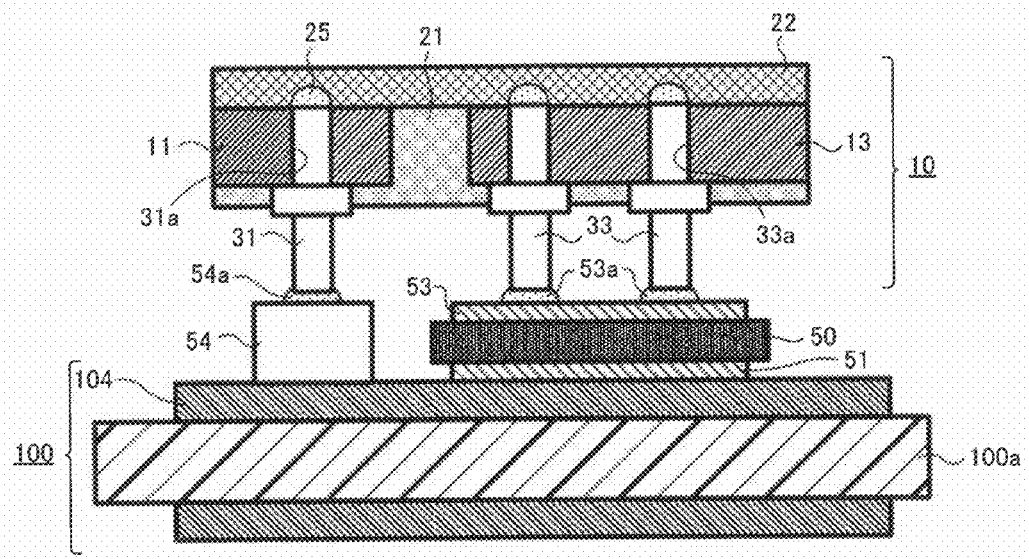
FIG. 1B is a cross-sectional view along line X-X' in FIG. 1A.
Figure 1C:
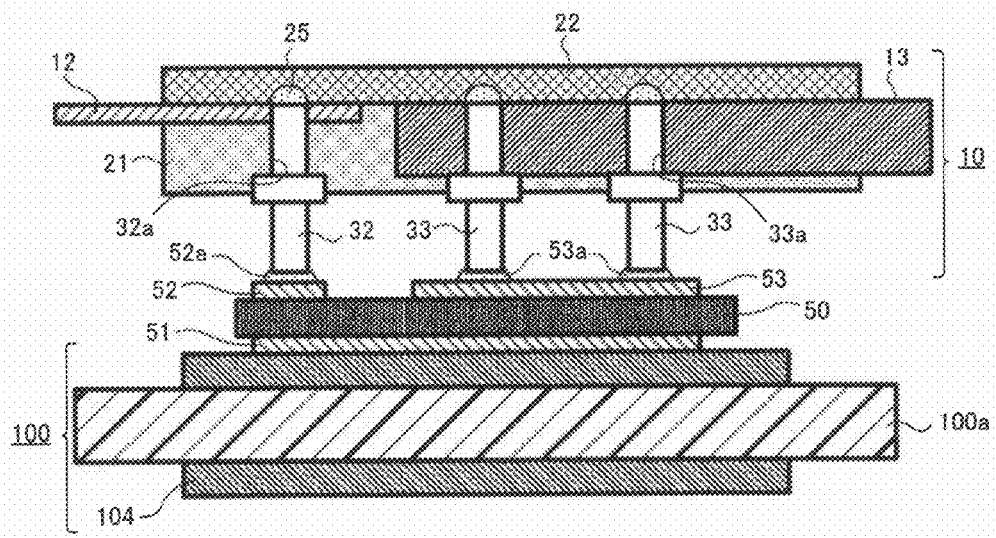
FIG. 1C is a cross-sectional view along line Y1-Y1' in FIG. 1A.
Figure 1D:
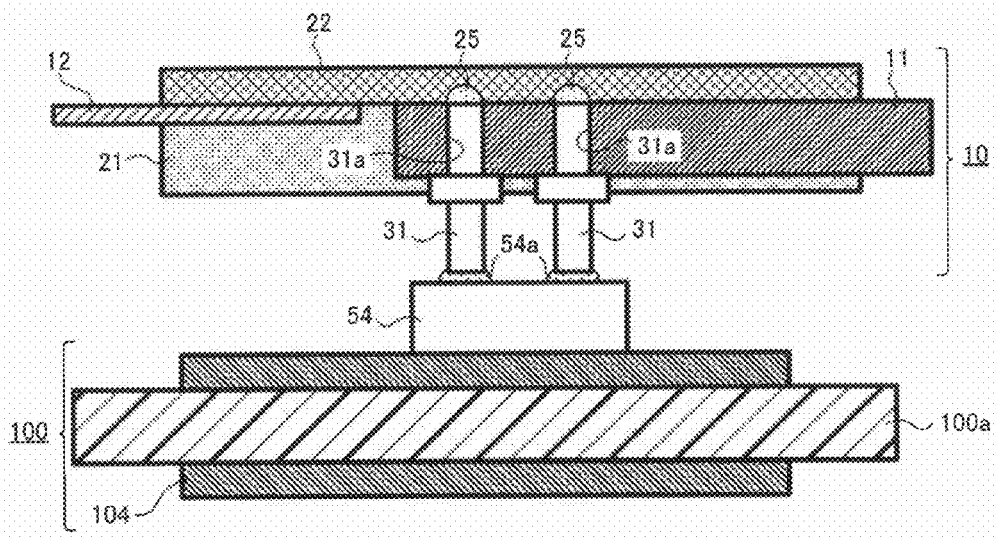
FIG. 1D is a cross-sectional view along line Y2-Y2' in FIG. 1A.
Figure 1E:
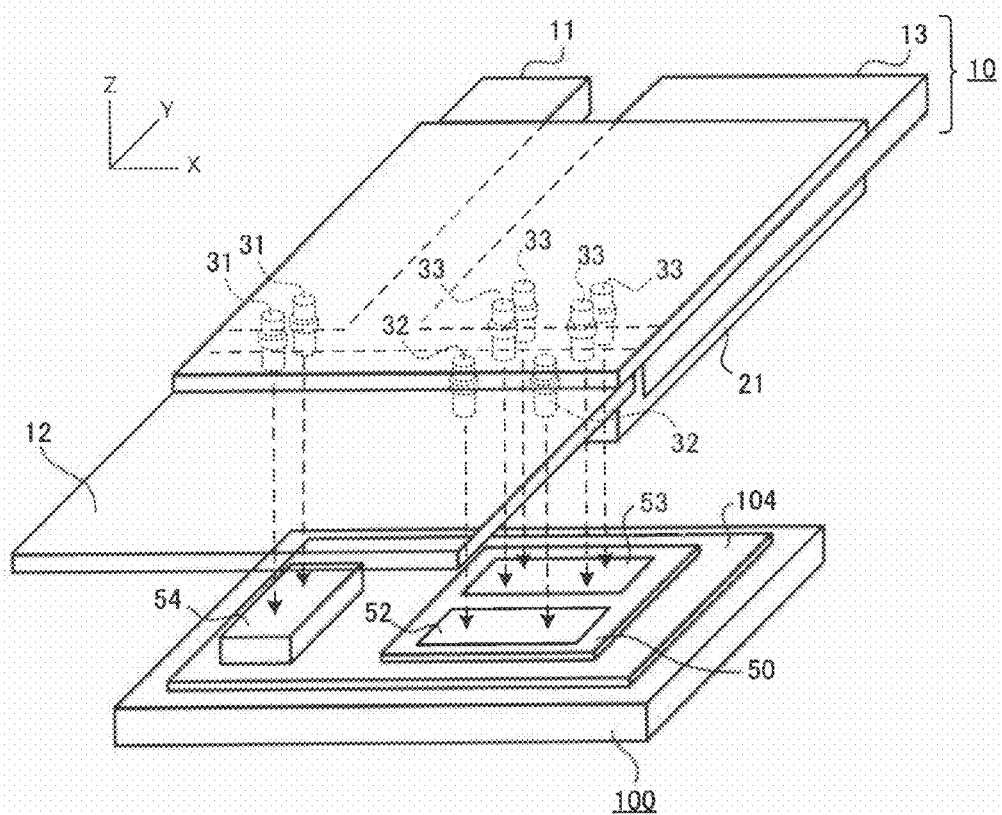
FIG. 1E is an exploded view showing the circuit board separated from the semiconductor module of FIG. 1A.

In FIG. 1A, a second metal plate 12 is depicted by dashed lines and shown transparent in order to make it easier to see the connection area between a circuit board 10 and a semiconductor device 50. FIG. 1B is a cross-sectional view along line X-X' in FIG. 1A, FIG. 1C is a cross-sectional view along line Y1-Y1' in FIG. 1A and FIG. 1D is a cross-sectional view along line Y2-Y2' in FIG. 1A. FIG. 1E shows the connection part of conductive posts 31 to 33 by arrows, with the circuit board 10 separated from the semiconductor module 1000.

As shown in FIGS. 1A to 1E, the semiconductor module 1000 of the present embodiment is provided with a circuit board 10, a semiconductor device 50 and a heat sink 100. The semiconductor module 1000 is mounted, for example, in an HV (hybrid vehicle) such as a FCHEV (fuel cell hybrid electric vehicle), and is used for example to boost the voltage from the battery or as a switching device for motor control. However, applications of the semiconductor module 1000 are not limited to this. The semiconductor device 50 is, for example, a square plate IGBT device, a GTO thyristor device or the like. It is possible to utilize a similar structure with a semiconductor device having two electrodes, such as a free wheeling diode (FWD) or the like.

On the bottom surface of the semiconductor device 50, a heat sink 100 is provided. Through this, heat-radiating properties are enhanced, it is easier to reduce the rising temperature of the semiconductor device 50 and it becomes easier to prevent damage and abnormal operations. On the other hand, the circuit board 10 is electrically connected to the top surface of the semiconductor device 50

The circuit board 10 has a first metal plate 11, a second metal plate 12, a third metal plate 13, insulating anchoring resin 21, reinforcing resin 22, a first conductive post 31, a second conductive post 32 and a third conductive post 33. Through this, at least one of the first through third metal plates 11 to 13 is positioned facing the semiconductor device 50, and is preferably connected electrically to the semiconductor device 50 via at least one of the first through third conductive posts 31 to 33. In the present embodiment, each of the first through third metal plates 11 to 13 is positioned facing the semiconductor device 50, and the circuit board 10 is electrically connected to the semiconductor device 50 via any of the first through third conductive posts 31 to 33.

The material of the first through third metal plates 11 to 13 is preferably a conductive material with high thermal transmittivity and high heat capacity. The first through third metal plates 11 to 13 are preferably made of Cu, a Cu—Cr alloy, a Cu—Ni—Si alloy or a Cu—Fe alloy, and more preferably made from Cu. The first through third metal plates 11 to 13 may be connected to any of the electrodes, but for example it is preferable for the second metal plate 12 to be connected to a control electrode (for example a gate electrode 52) of the semiconductor device 50. In consideration of mounting compatibility with an IPM (intelligent power module) substrate or the like or freedom of design, the second metal plate 12 preferably has more conductivity and flexibility than the other metal plates, and for example is preferably a metal foil or a flexible metal plate. However, the materials of the first through third metal plates 11 to 13 are not limited to these materials. It is possible to enhance mounting compatibility with the control board and freedom in design if at least one out of the first through third metal plates 11 to 13 has greater flexibility than the other metal plates.

In the present embodiment, the first and third metal plates 11 and 13 are each composed of copper plates for example around 1.0 mm thick. Because extremely large electric currents flow in HV (hybrid vehicles) such as FCHEV (fuel cell hybrid electric vehicles), it is desirable to enlarge the heat capacity in order to discharge heat.

In addition, in the present embodiment, the second metal plate 12 is composed of a copper plate for example around 0.2 mm thick. This makes it easier to endow the second metal plate 12 with flexibility and also makes mounting easier.

The anchoring resin 21 and the reinforcing resin 22 are used to anchor the first through third metal plates 11 to 13, for example, as shown in FIGS. 1B to 1D. The anchoring resin 21 is positioned between the first conductive post 31 and the second conductive post 32, between the second conductive post 32 and the third conductive post 33 and between the third conductive post 33 and the first conductive post 31, mechanically connecting and electrically insulating the first through third metal plates 11 to 13. The reinforcing resin 22 covers the first through third metal plates 11 to 13 and the anchoring resin 21.

By being anchored by the anchoring resin 21 and the reinforcing resin 22, it becomes easy to increase the connecting strength between the first through third metal plates 11 to 13. By using both the anchoring resin 21 and the reinforcing resin 22, it becomes easier to further stabilize the first through third metal plates 11 to 13 and other components. The anchoring resin 21 is considered to have achieved the effect of stabilizing the first through third metal plates 11 to 13 if the anchoring resin 21 is in at least one out of between the first conductive post 31 and the second conductive post 32, between the second conductive post 32 and the third conductive post 33 and between the third conductive post 33 and the first conductive post 31 and mechanically connects and electrically insulates at least two of the first through third metal plates 11 to 13. In addition, the reinforcing resin 22 is considered to achieve the effect of further stabilizing the first through third metal plates 11 to 13 and other components if the reinforcing resin 22 covers the anchoring resin 21 and at least one out of the first through third metal plates 11 to 13.

In the present embodiment, the anchoring resin 21 and the reinforcing resin 22 are composed of bismaleimide triazine resin (BT resin). However, this is intended to be illustrative and not limiting for the anchoring resin 21 and the reinforcing resin 22 may be any resin having insulating and heat resistance properties. As materials for the anchoring resin 21 or the reinforcing resin 22, epoxy resin, phenol resin, polyimide resin, polyamide, silicon resin and the like may be cited, for example. The anchoring resin 21 is preferably bismaleimide triazine resin, epoxy resin, phenol resin, polyimide resin, polyamide or silicon resin. In addition, the reinforcing resin 22 is preferably bismaleimide triazine resin, epoxy resin, phenol resin, polyimide resin, polyamide or silicon resin. However, the anchoring resin 21 and the reinforcing resin 22 are formed as necessary, and the shapes and materials thereof may be changed in accordance with application.

Holes 31a, 32a and 33a are formed in the anchoring resin 21 and the first through third metal plates 11 to 13 in order to insert (for example, fit) the first through third conductive posts 31 to 33 in predetermined positions. The holes 31a, 32a and 33a are, for example, through holes or holes with bottoms.

The first through third conductive posts 31 to 33 are connected to the first through third metal plates 11 to 13, respectively, and furthermore are electrically connected to a collector electrode 51 (first electrode), gate electrode 52 (second electrode) and emitter electrode 53 (third electrode) of the semiconductor device 50. Specifically, the first, second and third conductive posts 31, 32 and 33 are inserted into the holes 31a, 32a and 33a, respectively. Furthermore, solder 25 is positioned on one end of the first through third conductive posts 31 to 33. This solder 25 is also poured into contact parts with the first through third conductive posts 31 to 33 and the first through third metal plates 11 to 13 (see FIG. 2D). Through this, the first through third metal plates 11 to 13 and one end of the first through third conductive posts 31 to 33 are electrically connected via the solder 25, as shown in FIGS. 1B to 1D. From the perspective of connection strength and electrical properties and the like, it is preferable for at least one out of the connection between the first conductive post 31 and the first metal plate 11, the connection between the second conductive post 32 and the second metal plate 12 and the connection between the third conducive post 33 and the third metal plate 13 to be connected by solder. The first through third conductive posts 31 to 33 are preferably each fitted into the first through third metal plates 11 to 13. In addition, the reinforcing resin 22 preferably covers the insertion holes of the first through third conductive posts 31 to 33. This makes it easy to prevent the solder 25 from peeling off, and makes it easy to preserve connection reliability.

The materials for the first through third conductive posts 31 to 33 are arbitrary, but the first through third conductive posts 31 to 33 are preferably composed of Cu, a Cu—Cr alloy, a Cu—Ni—Si alloy, a Cu—Fe alloy, Al or an Al alloy, and more preferably Cu. In addition, at least one pair out of the first metal plate 11 and the first conductive post 31, the second metal plate 12 and the second conductive post 32, the third metal plate 13 and the third conductive post 33 are preferably composed of substantially similar materials. Through this, connection strength, electrical properties and the like are easily enhanced.

The type of solder 25 is arbitrary, but the solder 25 is preferably an Sn—Cu type, a Bi—Sn type, an Sn—Pb type, a Zn—Al type or an Sn—Zn type.

The semiconductor device 50 has a collector electrode 51, a gate electrode 52 and an emitter electrode 53. The semiconductor device 50 and a spacer 54 are mounted on a metal layer 104 formed on the heat sink 100. The material of the spacer 54 is an arbitrary conductor, and for example Cu or a Cu alloy may be used as the material of the spacer 54. Furthermore, the spacer 54 may be a metal, such as copper, plated on a core material composed of resin, metal or ceramic.

The collector electrode 51 is electrically connected to the metal layer 104, and is electrically connected to the first metal plate 11 via the spacer 54 and the first conductive post 31. The gate electrode 52 is electrically connected to the second metal plate 12 via the second conductive post 32. The emitter electrode 53 is electrically connected to the third metal plate 13 via the third conductive post 33. The first through third metal plates 11 to 13 are positioned roughly parallel to the surface of the semiconductor device 50. The spacer 54 is provided in accordance with the length of the first conductive post 31, and need not be supplied when not unifying the lengths of the conductive posts.

The heat sink 100 is composed of a substrate 100a, and a metal layer 104 formed on the top and bottom surfaces of the substrate 100a. In the present embodiment, the metal layer 104 is formed on both surfaces of the heat sink 100, but this is intended to be illustrative and not limiting, for the metal layer 104 may be formed only on the top surface (the surface on the mounting side) of the heat sink 100.

The material of the substrate 100a is preferably a material that has high heat radiation properties. In the present embodiment, the substrate 100a is composed, for example, of ceramic (for example, aluminum nitride: AlN; silicon nitride: SiN, Alumina: $Al_2O_3$; Berylia: BeO, or the like). However, the material of the substrate 100a is not limited to inorganic materials such as ceramics and may be resin or metal, for example. When the substrate 100a is composed of metal, the metal layer 104 may be omitted.

The semiconductor device 50 is mounted on the heat sink 100. As discussed above, the metal layer 104 is electrically connected to the first metal plate 11 via the first conductive post 31. In the present embodiment, only the metal layer 104 on the mounting side is electrically connected to the first metal plate 11. However, this is intended to be illustrative and not limiting, for the metal layer 104 on both sides may be electrically connected to the first metal plate 11.

Figure 2A:
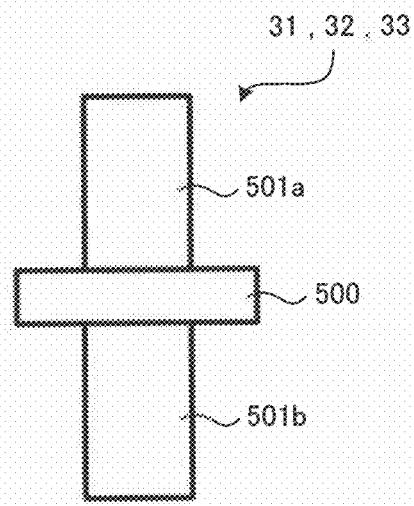
FIG. 2A is a side view of a conductive post according to the embodiment of the present invention.
Figure 2B:
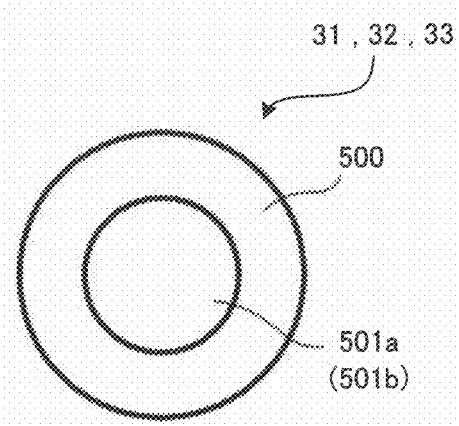
FIG. 2B is a top view of the conductive post according to the embodiment of the present invention.

FIG. 2A is a cross-sectional view of the first through third conductive posts 31 to 33 and FIG. 2B is a top view of the first through third conductive posts 31 to 33. The first through third conductive posts 31 to 33 are provided with a flange 500, a head 501a and a foot 501b. The shape of the first through third conductive posts 31 to 33 may be changed as necessary. The length of the head 501a and the length of the foot 501b are preferably roughly the same, but this is intended to be illustrative and not limiting.

Figure 2C:
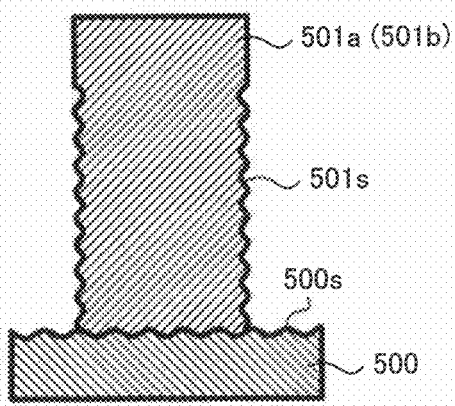
FIG. 2C is a cross-sectional view showing a variation of the conductive post according to the embodiment of the present invention.
Figure 2D:
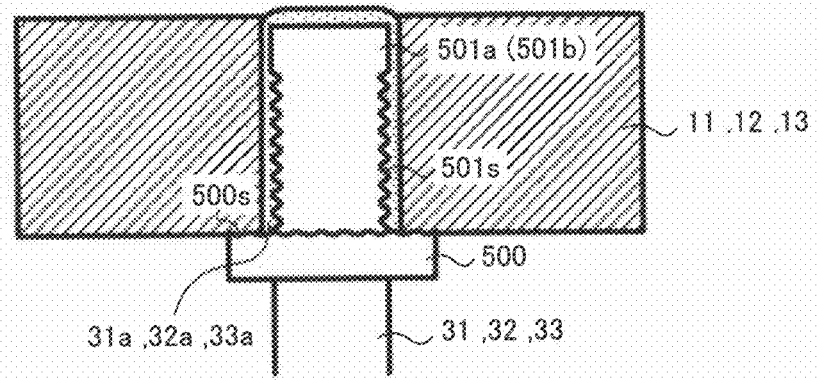
FIG. 2D is a cross-sectional view showing the contact between a metal plate and the conductive post according to FIG. 2C.

Furthermore, as shown in FIG. 2C, an uneven surface is preferably formed on a surface 500s of the flange 500 of the first through third conductive posts 31 to 33 and a surface 501s of the head 501a or the foot 501b. Through this, the surface area of the first through third conductive posts 31 to 33 is increased, and as shown in FIG. 2D, when the first through third conductive posts 31 to 33 are inserted into the holes 31a to 33a (through holes) in the first through third metal plates 11 to 13 and the solder 25 is formed, the surface area of contact between the first through third conductive posts 31 to 33 and the first through third metal plates 11 to 13 readily becomes larger. As a result, it is easily possible to increase connection reliability.

Figure 2E:
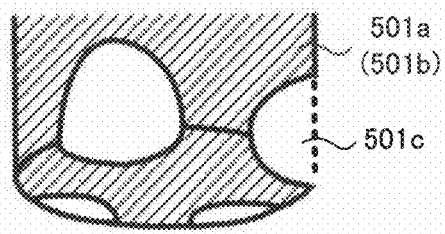
FIG. 2E is a drawing showing the end of a variation of the conductive post according to the embodiment of the present invention.
Figure 2F:
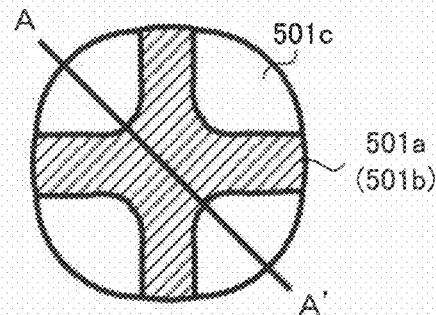
FIG. 2F is a planar view of the conductive post according to FIG. 2E.
Figure 2G:
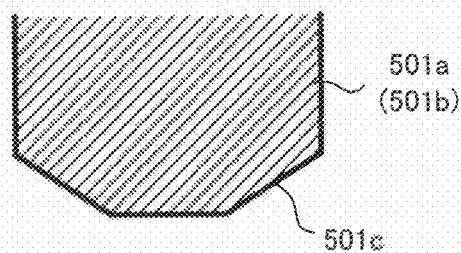
FIG. 2G is a cross-sectional view along line A-A' of the conductive post according to FIG. 2F.

Furthermore, a notch 501c is preferably formed on one or both of the head 501a and the foot 501b (each end) of the first through third conductive posts 31 to 33, as shown in FIGS. 2E to 2G. This makes it easy to increase contact surface area and is effective in removing air during solder reflow.

The thickness of the first through third conductive posts 31 to 33 may be changed in accordance with the connecting electrodes. The first through third conductive posts 31 to 33 may each have differing thicknesses. For example, the diameters of the first conductive post 31 and the third conductive post 33 connected to the collector electrode 51 and the emitter electrode 53, through which large electrical currents flow, are preferably smaller than the diameter of the second conductive post 32 connected to the gate electrode 52, through which comparatively small electrical currents flow. The smaller the contact surface areas of the semiconductor device 50 and the first through third conductive posts 31 to 33 are, the less likely for cracks to form, making it easier to enhance connection reliability. Furthermore, because it is necessary for large electrical currents to flow through the first and third conductive posts 31 and 33, it is preferable for the cross-sectional area of the first and third conductive posts 31 and 33 as a whole to be larger than that of the second conductive post 32 connected to the gate electrode 52, such as by increasing the number of these conductive posts. By so doing, it becomes easier to reduce the joule resistance of the first and third conductive posts 31 and 33.

It is preferable for the directions in which the first through third conductive posts 31 to 33 protrude from the first through third metal plates 11 to 13 (the lengthwise direction of the first through third conductive posts 31 to 33) to be substantially parallel to each other. In addition, the front edge surfaces of the first through third conductive posts 31 to 33 are preferably substantially parallel to each other. Through this, when the heat sink 100 and the circuit board 10 are positioned roughly parallel, it is easier to make the surfaces of the semiconductor device 50 and the spacer 54 interact orthogonally with the first through third semiconductor posts 31 to 33. As a result, it is easier to connect the first through third metal plates 11 to 13 to the semiconductor device 50 and the like without matching the directional properties of the rotation direction of the first through third conductive posts 31 to 33. In the present embodiment, the protrusion directions of the first through third conductive posts 31 to 33 are all in the Z direction (FIG. 1), and the front edge surfaces of the first through third conductive posts 31 to 33 are all in the X-Y plane (FIG. 1).

In the present embodiment, the first through third metal plates 11 to 13 are connected to the conductor (spacer 54) on the surface of the heat sink 100 and the conductors (gate electrode 52 and emitter electrode 53) on the surface of the semiconductor device 50 via the first through third conductive posts 31 to 33. With this kind of structure, even if the semiconductor module 1000 exceeds the glass transition temperature of resin exposed to and used in high temperatures, the first through third metal plates 11 to 13 can on their own secure stability of the components and metal plates themselves. Moreover, the first through third metal plates 11 to 13, unlike resin substrates, are less susceptible to thermal deformation and are less likely to remain deformed. Consequently, even under environments such as automobiles and other transportation equipment in which vibrations and shocks are abundant, it is possible to easily demonstrate the effect of maintaining the stability of components.

The method of producing the circuit board 10 according to the embodiment of the present invention is described below.

Figure 3A:
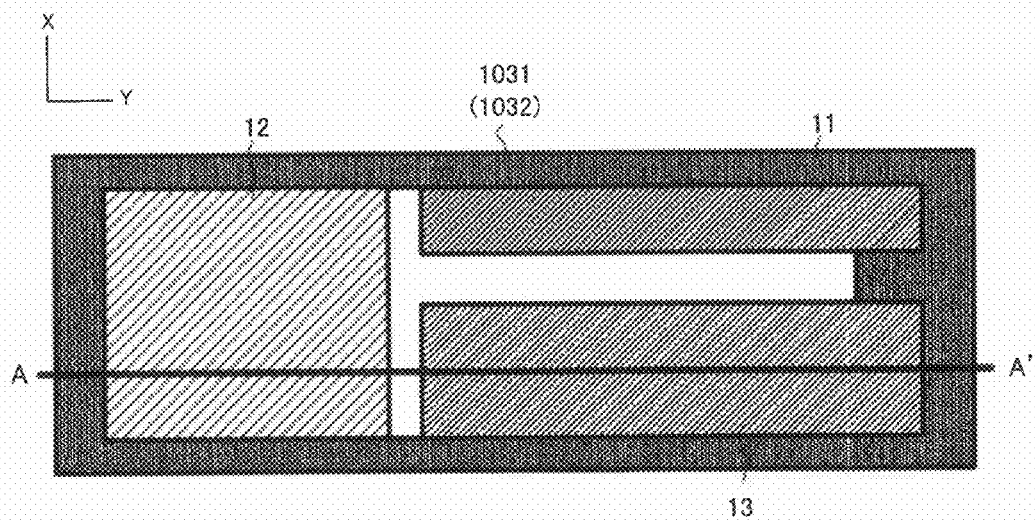
FIG. 3A is a cross-sectional view used to explain the procedure for anchoring the first through third metal plates into a metal mold jig according to the embodiment of the present invention.
Figure 3B:
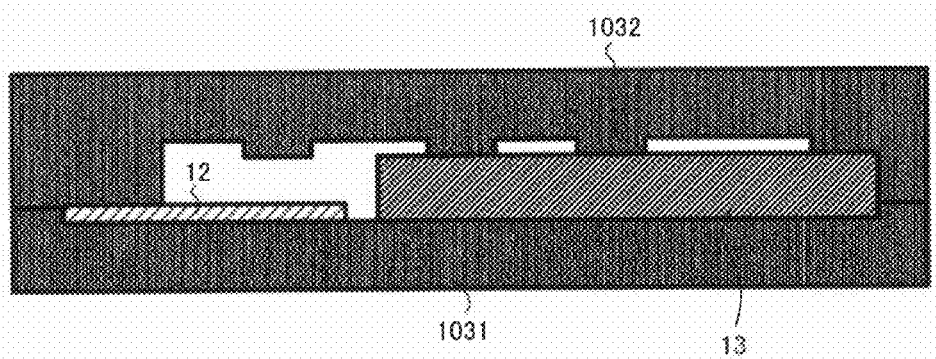
FIG. 3B is a cross-sectional view along line A-A' in FIG. 3A.

FIG. 3A is a cross-sectional view at the position of the metal plate, and FIG. 3B is a cross-sectional view along line A-A' in FIG. 3A.

Figure 3C:
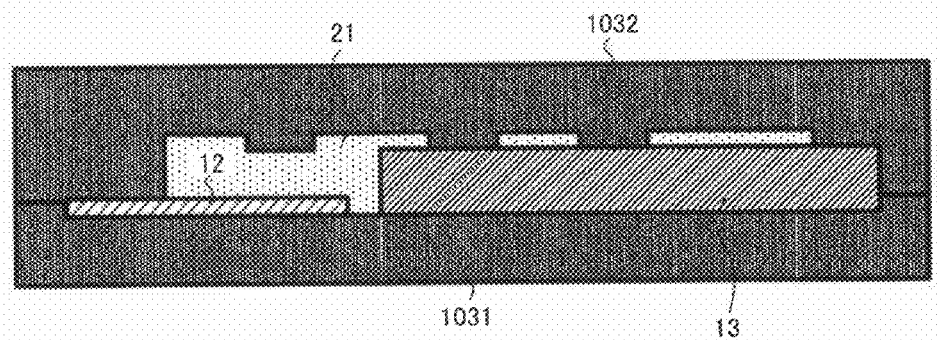
FIG. 3C is cross-sectional view used to explain the procedure for pouring anchoring resin according to the embodiment of the present invention.
Figure 3D:
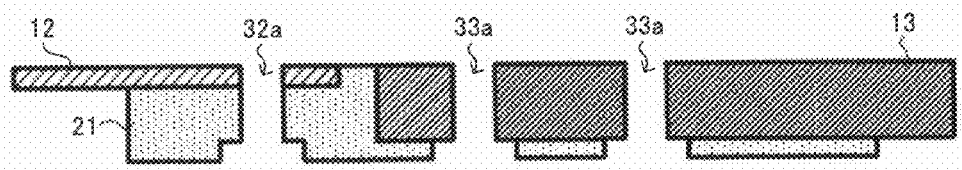
FIG. 3D is a cross-sectional view used to explain the procedure for boring holes in which to insert the first through third conductive posts according to the embodiment of the present invention.

As shown in FIGS. 3A and 3B, the first through third metal plates 11 to 13 are arranged in predetermined positions on the metal mold jig 1031, and the first through third metal plates 11 to 13 are anchored by the metal mold jib 1032. Next, as shown in FIG. 3C, anchoring resin 21 is poured from a pouring mouth (unrepresented) provided in the metal mold jig 1031 or 1032. Furthermore, after heating and solidifying, the metal mold jigs 1031 and 1032 are removed.

Next, holes 31a, 32a and 33a (only holes 32a and 33a are shown in the drawing) are bored in order to insert the first through third conductive posts 31 to 33 in predetermined positions.

Figure 3E:
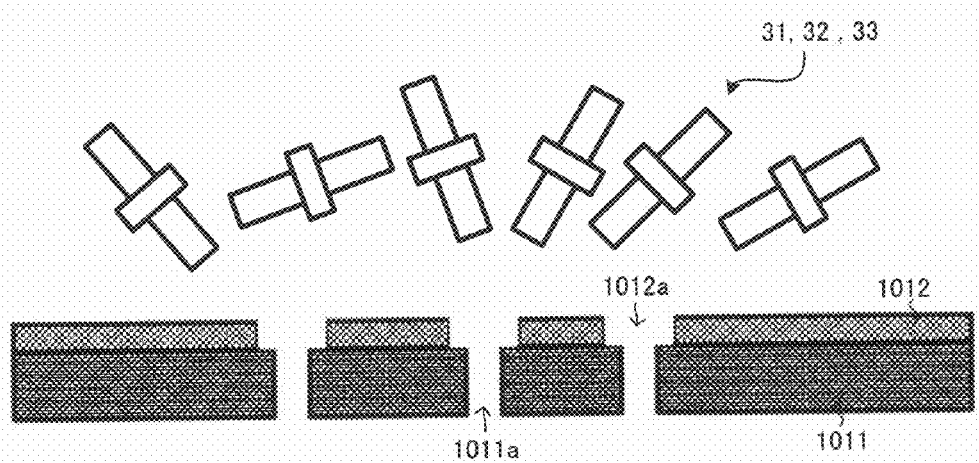
FIG. 3E is a drawing used to explain the procedure for preparing a first jig and a second jig according to the embodiment of the present invention.
Figure 3F:
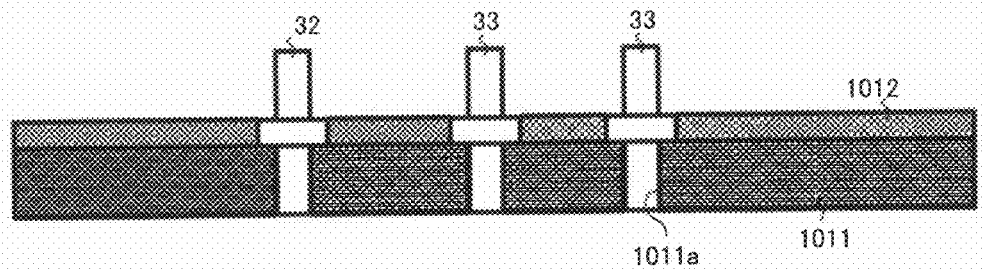
FIG. 3F is a drawing used to explain the procedure for fitting conductive posts into holes according to the embodiment of the present invention.
Figure 3G:
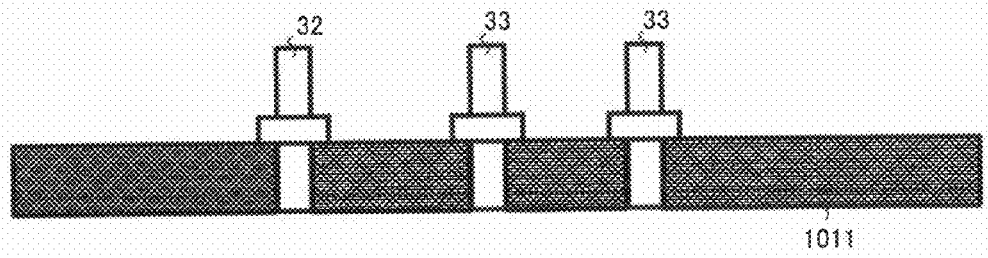
FIG. 3G is a drawing used to explain the procedure for removing the second jig according to the embodiment of the present invention.

Next, as shown in FIGS. 3E to 3G, the first through third conductive posts 31 to 33 are fitted into the first through third metal plates 11 to 13 using a first jig 1011 and a second jig 1012.

As shown in FIG. 3E, the first jig 1011 and the second jig 1012 are prepared. The first jig 1011 has holes 1011a with diameters the same as or slightly larger than the shaft diameters of the first through third conductive posts 31 to 33. The holes 1011a are formed in correspondence with the positions into which the first through third conductive posts 31 to 33 are fitted. The second jig 1021 is a jig for housing the flanges 500 (FIG. 2A) of the first through third conductive posts 31 to 33 in holes 1012a. As shown in FIG. 3F, by causing the first jig 1011 and 1012 to vibrate, the first through third conductive posts 31 to 33 (only the second and third conductive posts 32 and 33 are shown in the drawing) are fitted into the holes 1011a.

Figure 3H:
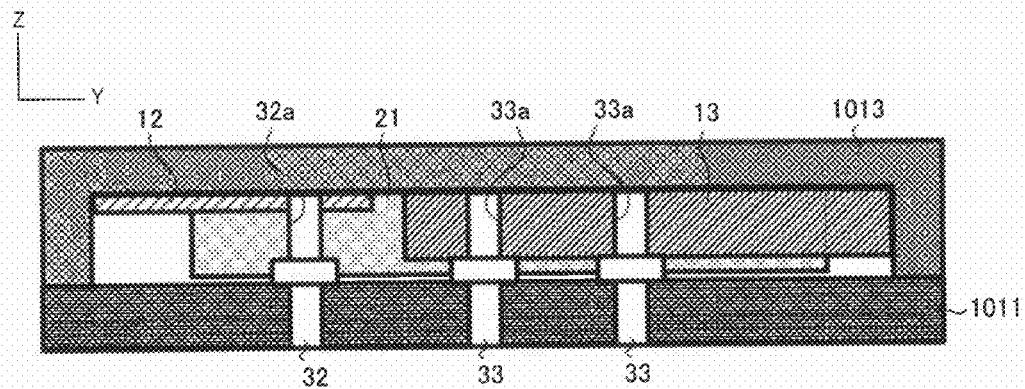
FIG. 3H is a drawing used to explain the pressing procedure according to the embodiment of the present invention.

As shown in FIG. 3G, after the second jig 1012 is removed, the first through third metal plates 11 to 13 anchored by the anchoring resin 21 are held down and pressed using a jig 1013, as shown in FIG. 3H. Through this, the first through third conductive posts 31 to 33 are fitted (press fit inserted) into the holes 31a, 32a and 33a (see FIGS. 1B and 1C) formed in the first through third metal plates 11 to 13. As a result, the two are interlocked.

Figure 3I:
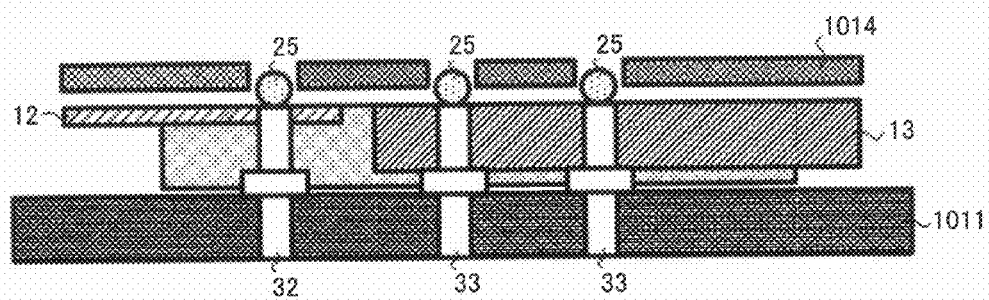
FIG. 3I is a drawing used to explain the procedure for loading solder balls according to the embodiment of the present invention.

Next, as shown in FIG. 3I, ball-shaped solder 25 (solder balls) is mounted on the first through third conductive posts 31 to 33 using a solder mask 1014. For the solder mask, it is possible to use a thin material with holes positioned corresponding to the conductive posts. In addition, the solder ball may be solder of the Sn—Cu type, Bi—Sn type, Sn—Pb type, Zn—Al type, Sn—Zn type or the like formed into a ball, and the size may be selected from several dozen μm to around 1 mm in accordance with the necessary quantity of solder.

Next, after removing the solder mask, the solder 25 is melted by reflowing at around 200° to 250° C., for example, and flows into the gaps in the holes 31a, 32a and 33a (FIG. 2D). As a result, the first through third metal plates 11 to 13 and the first through third conductive posts 31 to 33 are firmly connected.

Figure 3J:
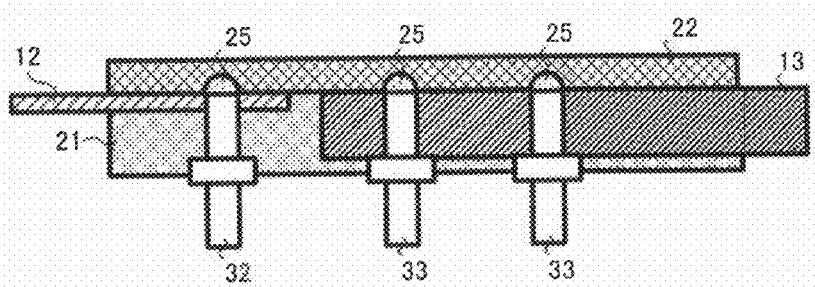
FIG. 3J is a drawing used to explain the procedure for forming reinforcing resin according to the embodiment of the present invention.

Next, as shown in FIG. 3J, reinforcing resin 22 is formed on the entire surface of the metal plates 11 to 13, including the solder 25. Through this, the circuit board 10 is completed.

Next, a method of producing the heat sink 100 according to this embodiment of the present invention is described below.

Figure 4A:
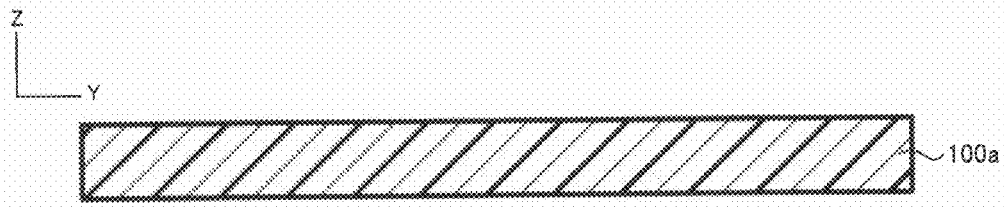
FIG. 4A is a cross-sectional view used to explain the procedure for producing a heat sink according to the embodiment of the present invention.
Figure 4B:
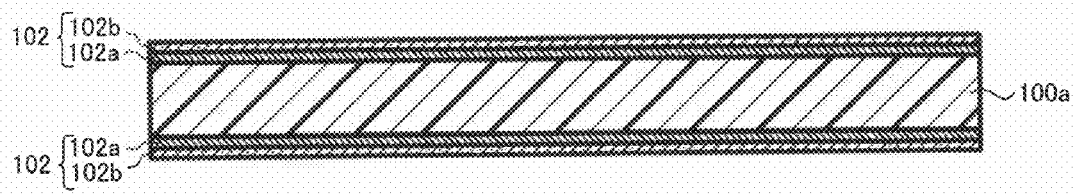
FIG. 4B is a cross-sectional view used to explain the procedure for producing a heat sink according to the embodiment of the present invention.

As shown in FIG. 4A, a substrate 100a composed of ceramic is prepared. Next, as shown in FIG. 4B, a first groundwork layer 102a composed of titanium (Ti) with a thickness of around 0.1 μm and a second groundwork layer 102b composed of copper with a thickness of around 1.0 μm are formed in that order on both surfaces of the substrate 100a through sputtering for around 5 to 15 minutes with around 4 to 5 kW DG of an Ar plasma, for example. Through this, a groundwork layer 102 composed of the first groundwork layer 102a and the second groundwork layer 102b is formed. The first and second groundwork layers 102a and 102b are each formed as beta patterns.

Figure 4C:
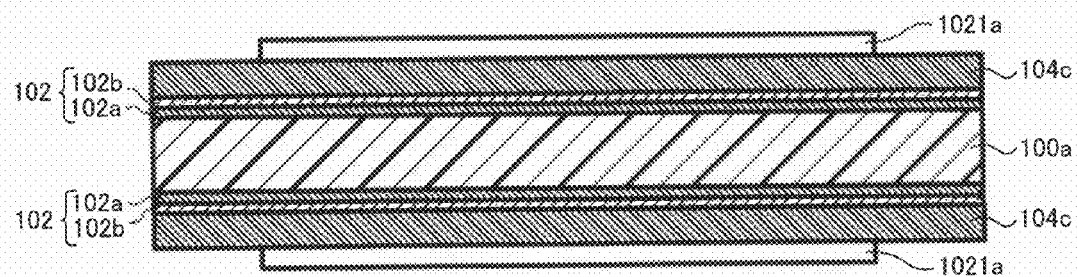
FIG. 4C is a cross-sectional view used to explain the procedure for producing a heat sink according to the embodiment of the present invention.

Next, as shown in FIG. 4C, an electroplated film 104c is formed on both surfaces on the groundwork layer 102. Specifically, electrolytic copper plating is accomplished for around 30 minutes with an electric current volume of 3 A/dm$^2$ after submersion in a solution of copper sulfate with the substrate 100a as the cathode and a copper plate electrode as the anode, for example.

Next, an etching resist 1021a is formed at a predetermined position on the electroplated film 104c. The etching resist forms a circuit pattern. As the etching film, it is possible to use a printing method in which an acid-resistant ink is screen printed, for example, or a photography method in which the entire surface of the electroplated film 104c is covered by a photosensitive agent and dry film, only the conductive pattern portion is exposed to light, developing and fixing are performed and the acid-resistant coating is left.

Figure 4D:
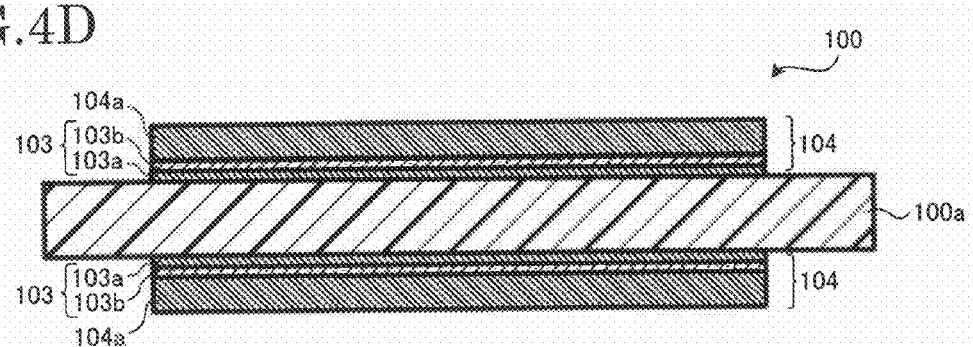
FIG. 4D is a cross-sectional view used to explain the procedure for producing a heat sink according to the embodiment of the present invention.

Next, as shown in FIG. 4D, the groundwork layer 102 and the electroplated film 104c exposed from the etching resist 1021a on both sides of the substrate 100a are removed by etching. Through this, a metal layer 104a and a groundwork layer 103 are formed on both sides of the substrate 100a, and a metal layer 104 composed of this metal layer 104a and the groundwork layer 103 is completed. The groundwork layer 103 is composed of a first groundwork layer 103a and a second groundwork layer 103b, and is a circuit pattern, not a beta pattern. As the copper etching fluid, it is possible to use a CuCl$_2$ solution or a fluoro-nitric acid solution (fluorine: nitric acid:water ratio of 1:1:18) for etching Ti. Through the above, the heat sink 100 is completed.

Figure 5A:
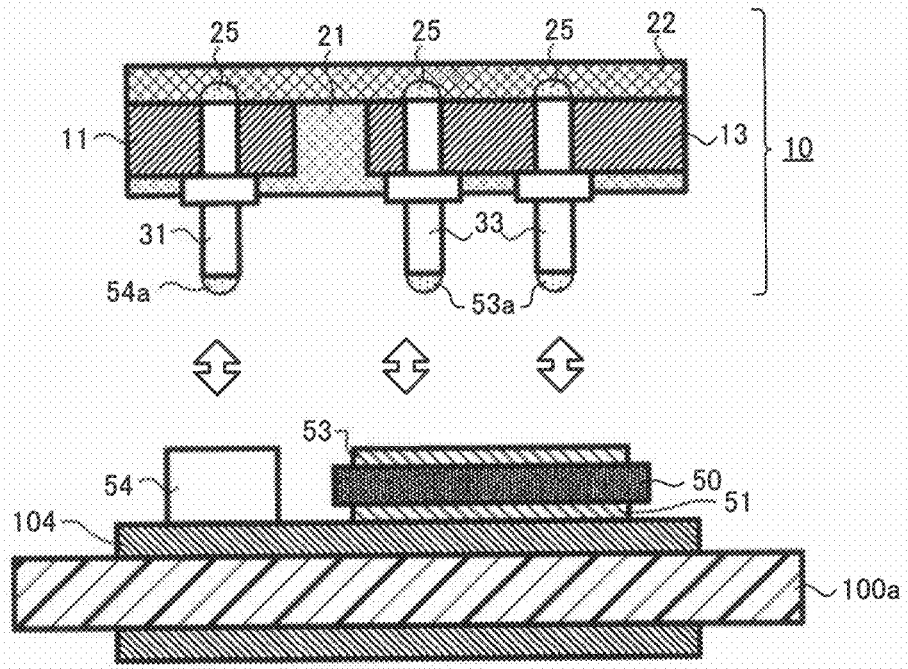
FIG. 5A is a drawing used to explain the procedure for producing a semiconductor module according to the embodiment of the present invention.
Figure 5B:
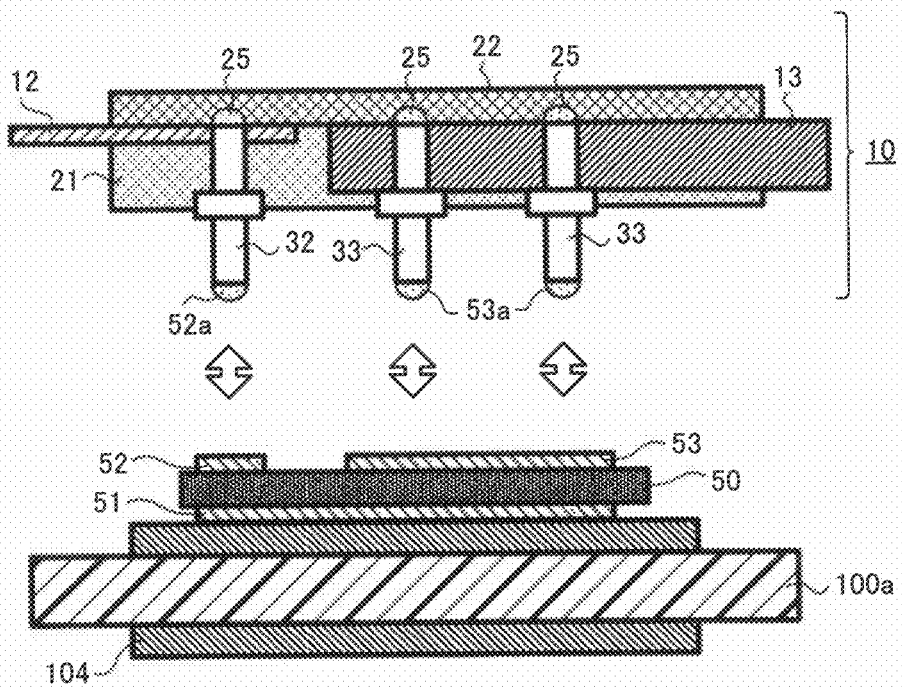
FIG. 5B is a drawing used to explain the procedure for producing a semiconductor module according to the embodiment of the present invention.

Furthermore, as shown in FIG. 5A (corresponding to the cross section in FIG. 1B) and FIG. 5B (corresponding to the cross section in FIG. 1C), the semiconductor device 50 and the spacer 54 mounted on the heat sink 100, and the circuit board 10, are mounted via solders 52a to 54a, and thereby the semiconductor module 1000 according to this embodiment of the present invention is completed.

The connection between the second and third conductive posts 32 and 33 and the semiconductor device 50, and the connection between the first conductive post 31 and the spacer 54, use solders 52a to 54a (FIGS. 1B to 1D). It is possible to form the solders 52a to 54a by immersing the tip of the first through third conductive posts 31 to 33 in a vat in which Sn—Cu type, Bi—Sn type, Sn—Pb type, Zn—Al type or Sn—Zn type solder, for example, has been melted. In addition, the solder layer may be formed by using solder balls on top of the semiconductor device 50 (gate electrode 52 and emitter electrode 53) and the heat sink 100 (spacer 54).

The method of producing the present embodiment is applied to production of the semiconductor module 1000. With this kind of production method, a good semiconductor module 1000 can be obtained at low cost.

The present invention is not limited to the above-described embodiment, for the following changes are also possible, for example.

Figure 6A:
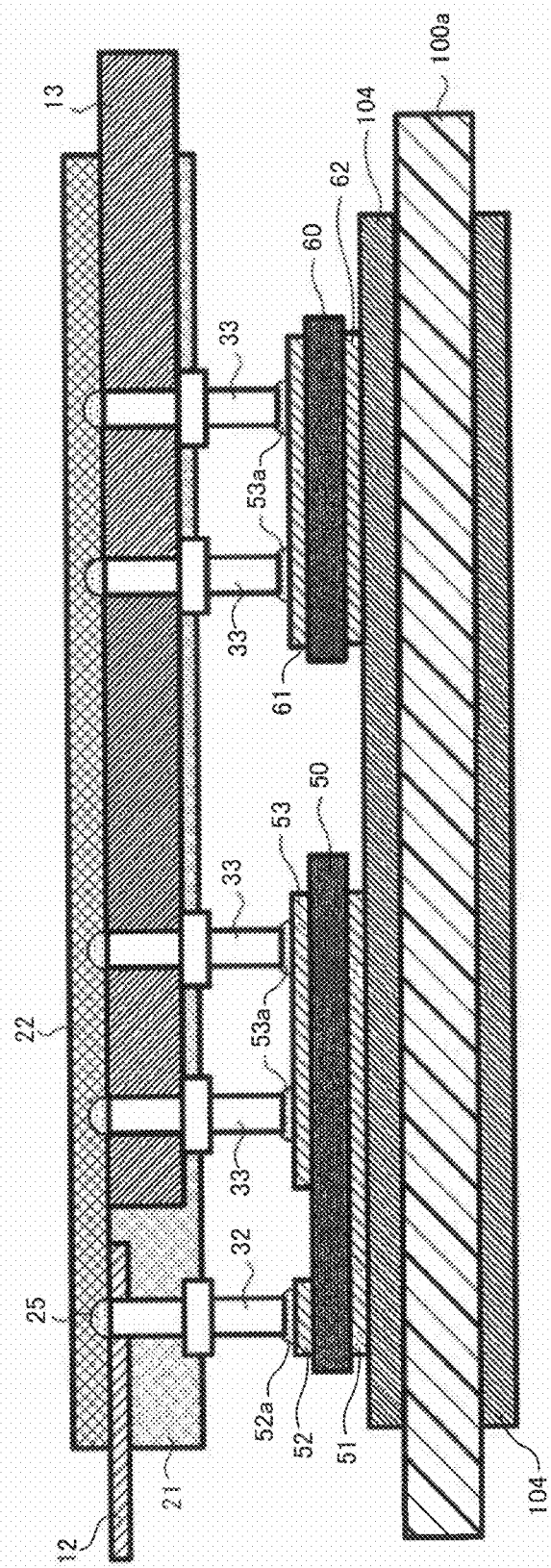
FIG. 6A is a drawing used to explain the semiconductor module according to the embodiment of the present invention on which an FWD device is mounted in addition to an IGBT device.
Figure 6B:
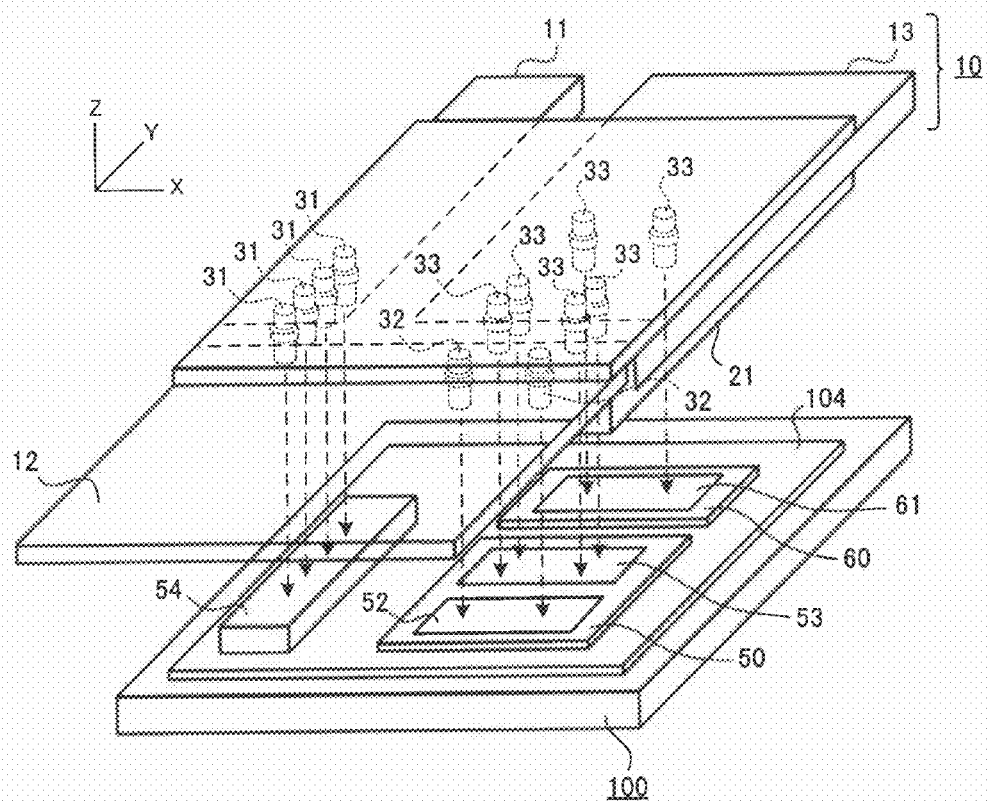
FIG. 6B is an exploded view showing the circuit board separated from the semiconductor module of FIG. 6A.

A plurality of semiconductor devices may be used. In addition, a plurality of semiconductor devices of differing types may be used. For example, as shown in FIGS. 6A and 6B, in addition to the IGBT device (semiconductor device 50) a separate FWD device 60 may be mounted in parallel between the emitter and collector of the IGBT device. The top surface of the FWD device 60 is electrically connected to the first through third metal plates 11 to 13 via the first through third conductive posts 31 to 33, the same as the semiconductor device 50. By arranging the FWD device 60 in parallel with the IGBT device, it is possible to mitigate the noise (reverse electric current) generated by switching of the IGBT device.

In the example in FIGS. 6A and 6B, the FWD device 60 has an electrode 61 on a first surface and an electrode 62 on a second surface on the side opposite the first surface. The FWD device 60 is mounted on the metal layer 104 formed on the heat sink 100. The electrode 61 is electrically connected to the third metal plate 13 via the third conductive post 33. The electrode 62 is electrically connected to the first metal plate 11 via the metal layer 104 and the first conductive post 31.

A variation on the circuit board 10 is described below with reference to FIGS. 7A to 7G. FIGS. 7A to 7G respectively show cross sections corresponding to the cross sections shown in FIG. 1C.

Figure 7A:
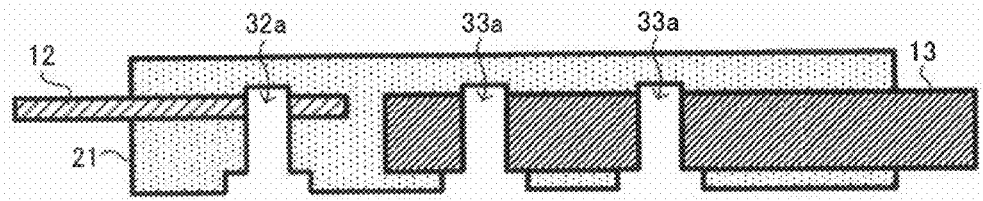
FIG. 7A is a cross-sectional view showing a variation of the circuit board according to the embodiment of the present invention.

As shown in FIG. 7A, the holes 31a, 32a and 33a (only holes 32a and 33a are shown in the drawing) may be holes with bottoms that do not pass through the anchoring resin 21. In this case, the anchoring resin 21 can fill the role of the reinforcing resin 22, making it possible to reduce the number of processes and also prevent peeling off the solder 25 (see FIGS. 1B and 1C), thereby preserving connection reliability.

Figure 7B:
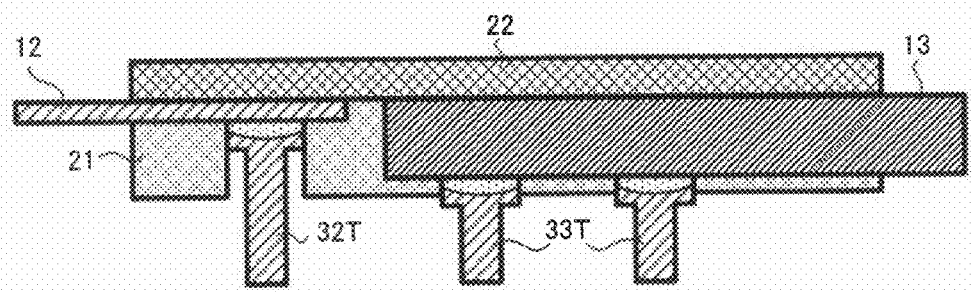
FIG. 7B is a cross-sectional view showing a variation of the circuit board according to the embodiment of the present invention.

As shown in FIG. 7B, the holes 31a, 32a and 33a (see FIG. 2D) formed in the first through third metal plates 11 to 13 for fitting the first through third conductive posts 31 to 33 may be holes with bottoms exposing the first through third metal plates 11 to 13 (only the second and third metal plates 12 and 13 are shown in the drawing). Furthermore, conductive posts 32T and 33T having T-shaped cross-sections may be connected to these holes with bottoms. Through this, it is possible to control tilting of the first through third conductive posts 31 to 33 and to electrically connect to the first through third metal plates 11 to 13 more surely.

Figure 7C:
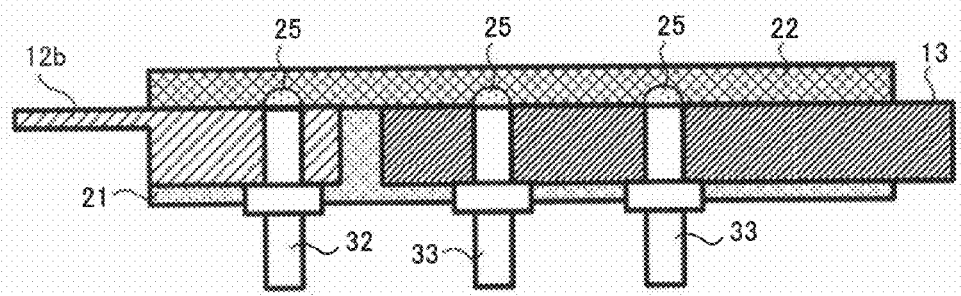
FIG. 7C is a cross-sectional view showing a variation of the circuit board according to the embodiment of the present invention.

As shown in FIG. 7C, a second metal plate 12b having roughly the same thickness in the part covered by the anchoring resin 21 and the reinforcing resin 22 as the first and third metal plates 11 and 13 may be used in place of the second metal plate 12. Through this, the first through third conductive posts 31 to 33 are surely formed on a roughly planar surface and furthermore it is possible to enlarge the contact surface area between the second conductive post 32 and the second metal plate 12b. As a result, the connection reliability of the second conductive post 32 is readily enhanced.

In addition, by making the thickness of the part of the second metal plate 12b not covered by the anchoring resin 21 and the reinforcing resin 22 thinner than the first and third metal plates 11 and 13, it is possible to endow the second metal plate 12b with flexibility, increasing ease of mounting.

Figure 7D:
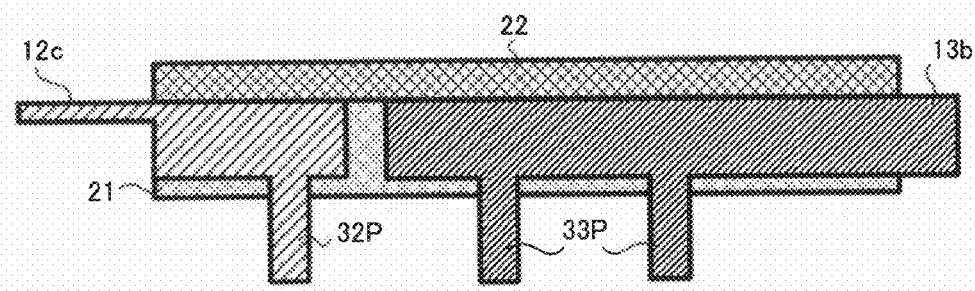
FIG. 7D is a cross-sectional view showing a variation of the circuit board according to the embodiment of the present invention.

The first through third conductive posts 31 to 33 may be formed with the same material as the first through third metal plates 11 to 13 by processing the metal plates. For example, as shown in FIG. 7D, the second and third conductive posts 32P and 33P may be formed of the same material and integrally with the second and third metal plates 12c and 13b by processing the second and third metal plates 12c and 13b. Through this, it is possible to reduce the number of processes because the process of forming holes for insertion into the metal plates and the process of inserting the conductive posts are not needed.

Figure 7E:
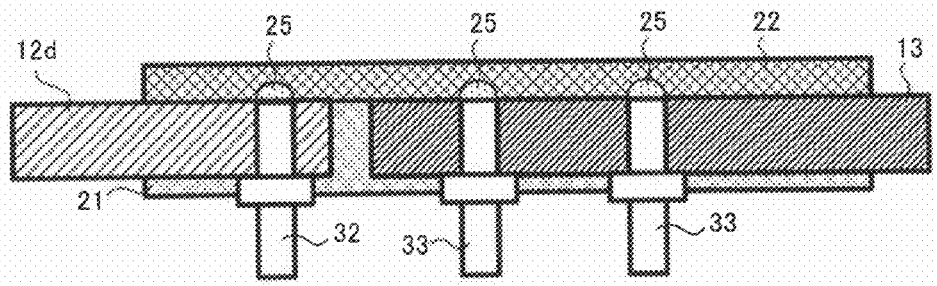
FIG. 7E is a cross-sectional view showing a variation of the circuit board according to the embodiment of the present invention.

The thicknesses of the first through third metal plates 11 to 13 may all be roughly the same. For example, the second metal plate 12d may be used in place of the second metal plate 12, as shown in FIG. 7E. Through this, its becomes easier to form the first through third conductive posts 31 to 33 on roughly the same plane, and moreover, it becomes possible to enlarge the contact surface area between the second conductive post 32 and the second metal plate 12d. As a result, the connection reliability of the second conductive post 32 is enhanced. In addition, it is possible to prevent cracking and breaking caused by thermal expansion because the thickness of the anchoring resin 21 can be formed substantially uniformly.

Figure 7F:
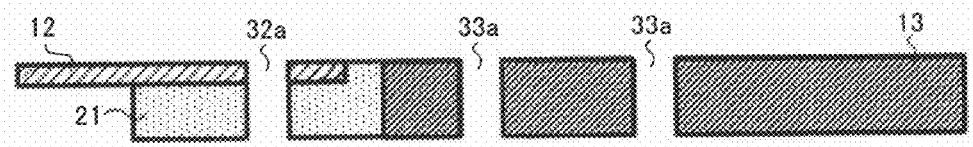
FIG. 7F is a cross-sectional view showing a variation of the circuit board according to the embodiment of the present invention.
Figure 7G:
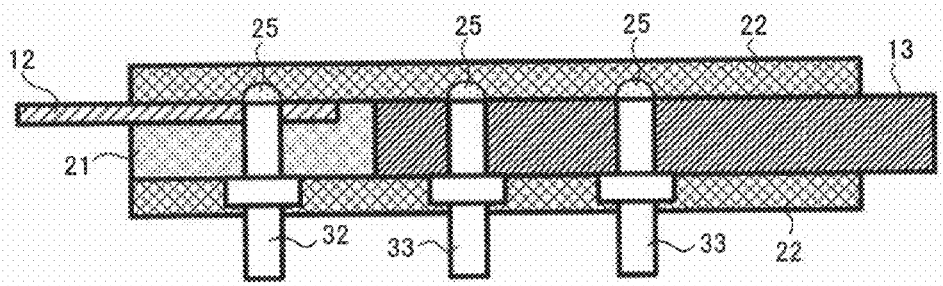
FIG. 7G is a cross-sectional view showing an example of a conductive post inserted into the circuit board of FIG. 7F, with both sides covered by reinforcing resin.

For example, as shown in FIG. 7F, the thickness of anchoring resin 21 provided on the bottom surface of the second metal plate 12 may be adjusted so as to be roughly the same as the first and third metal plates 11 and 13. That is to say, in this case the anchoring resin 21 is not covered on the first and third metal plates 11 and 13. Following that, as shown in FIG. 7G, the second metal plate 12 may be connected by the anchoring resin 21, the first through third conductive posts 31 to 33 may be inserted and the upper and lower surfaces covered by the reinforcing resin 22 so as to anchor these. Through this, the first through third conductive posts 31 to 33 are formed roughly coplanar, and the flanges 500 (FIG. 2A) of the first through third conductive posts 31 to 33 and the various metal plates can be connected with certainty. As a result, it becomes easier to enhance the connection reliability of the first through third conductive posts 31 to 33. Furthermore, strength is increased because the reinforcing resin 22 can be formed on the top and bottom surfaces of the third metal plate 13.

The shapes of the first through third conductive posts 31 to 33 are arbitrary and are not limited to that shown in FIGS. 2A through 2G. For example, the shape of the first through third conductive posts 31 to 33 may be a polygonal column. In addition, the shapes of the first through third conductive posts 31 to 33 may be different from each other. However, manufacturing is made easier by making the first through third conductive posts 31 to 33 have roughly the same shape.

Figure 8A:
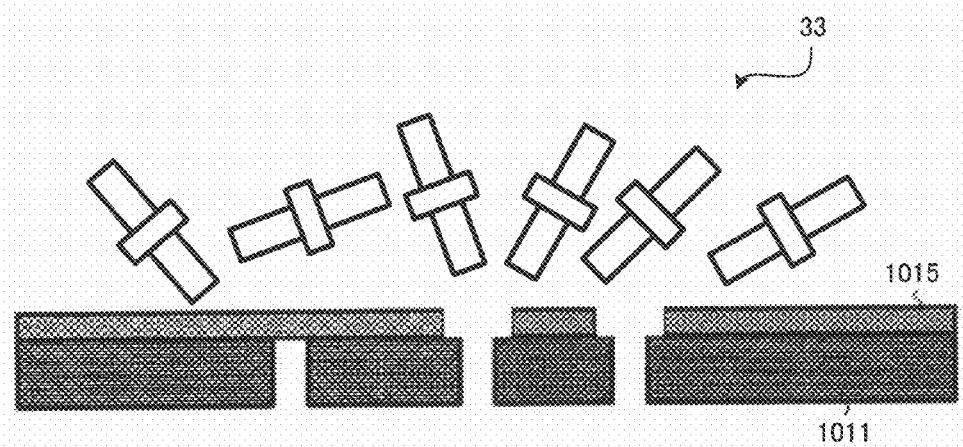
FIG. 8A is a drawing used to explain a variation of the method of setting the conductive posts in the jig according to the embodiment of the present invention.
Figure 8B:
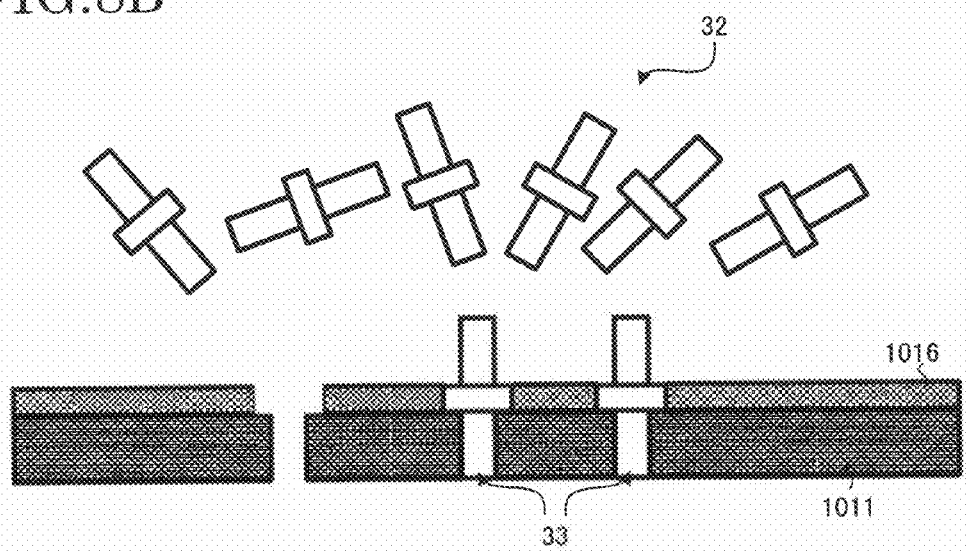
FIG. 8B is a drawing used to explain a variation of the method of setting the conductive posts in the jig according to the embodiment of the present invention.

When the first through third conductive posts 31 to 33 have mutually differing shapes, the first through third conductive posts 31 to 33 are set in the jib using the method shown in FIGS. 8A and 8B, for example.

With this method, first the through holes in which the first and second conductive posts 31 and 32 other than the third conductive post 33 are to be inserted are blocked using a second jig 1015, and the third conductive post 33 is set up in the first jig 1011, as shown in FIG. 8A. Next, as shown in FIG. 8B, the through hole (not shown) into which the first conductive post 31 is to be inserted is blocked using a third jig 1016, and the second conductive post 32 is set up in the first jig 1011. Through this, the second and third conductive posts 32 and 33 are inserted into the through holes other than the through hole into which the first conductive post 31 is to be inserted, out of the through holes of the first jig 1011, so subsequently, the first conductive post 31 is inserted into the remaining through hole in the first jig 1011. As a result, all of the first through third conductive posts 31 to 33 are set up in the first jig 1011. With this kind of method, it is possible to set the first through third conductive posts 31 to 33 in the jig. However, this embodiment is not restricted to this method, and for example the conductive posts may be set up one at a time while paying close attention to the orientation of the first through third conductive posts 31 to 33.

In the above-described embodiment, the materials and sizes of the various components can be arbitrarily changed. For example, the thicknesses of the first through third metal plates 11 to 13 may be roughly the same as each other. The anchoring resin 21 and the reinforcing resin 22 may have mutually differing lengths and shapes. In addition, the materials of the first through third conductive posts 31 to 33 are arbitrary so long as the materials are conductive. For example, a metal other than copper may be used.

Regarding other points as well, it is possible to arbitrarily change the composition of the circuit board 10, the semiconductor device 50 or the heat sink 100 or the like (constituent elements, dimensions, materials, shape, number of layers, arrangement or the like) without departing from the principles of the present invention. For example, the circuit board 10 may have four or more metal plates.

The order of the processes of the above-described embodiment can be arbitrarily changed without departing from the principles of the present invention. In addition, unnecessary processes may be omitted in accordance with the application.

The circuit board 10 may be manufactured using methods such as that shown in FIGS. 9A to 9H without using the metal mold jigs 1031 and 1032 (FIGS. 3A to 3C). FIGS. 9A to 9H respectively show cross-sections corresponding to the cross-sections shown in FIG. 1C.

Figure 9A:
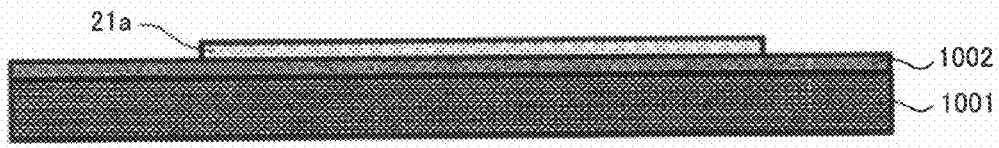
FIG. 9A is a drawing used to explain a variation on the method of producing the circuit board according to the embodiment of the present invention.

With this method, first separation paper 1002 and reinforcing resin 21a are layered in that order on a lower jig 1001, as shown in FIG. 9A.

Figure 9B:
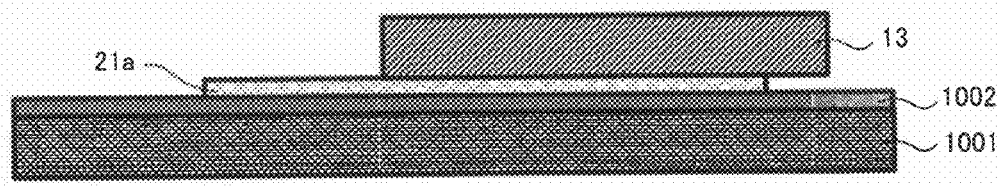
FIG. 9B is a drawing used to explain a variation on the method of producing the circuit board according to the embodiment of the present invention.

Next, as shown in FIG. 9B, first and third metal plates 11 and 13 (only the third metal plate 13 is shown in the drawing) are layered on top of the reinforcing resin 21a.

Figure 9C:
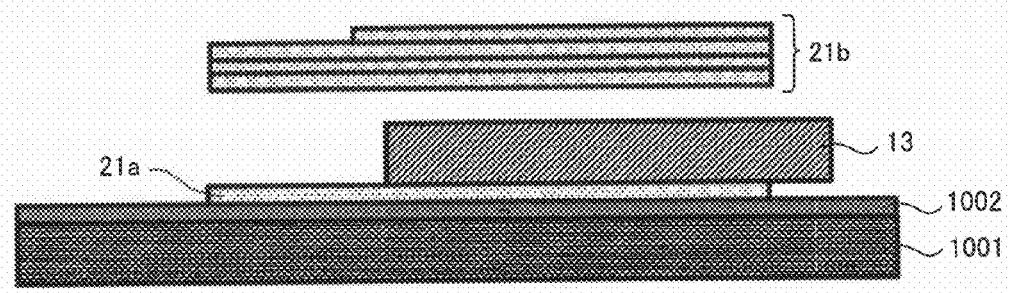
FIG. 9C is a drawing used to explain a variation on the method of producing the circuit board according to the embodiment of the present invention.

Next, as shown in FIG. 9C, a reinforcing resin layer 21b composed of a plurality of layers is formed between the first metal plate 11 and the third metal plate 13 (see FIG. 1A).

Figure 9D:
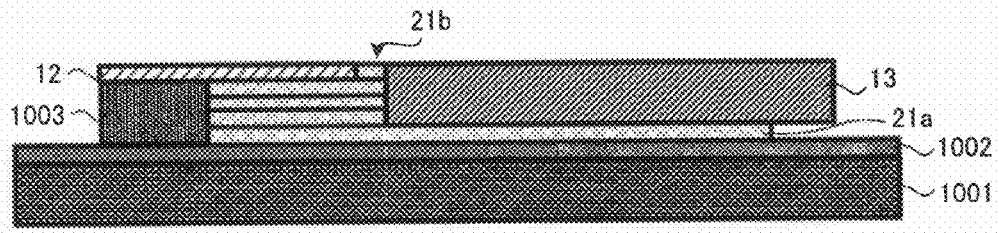
FIG. 9D is a drawing used to explain a variation on the method of producing the circuit board according to the embodiment of the present invention.

Next, as shown in FIG. 9D, a spacer 1003 for adjusting height is positioned and the second metal plate 12 is deposited at a predetermined position.

Figure 9E:
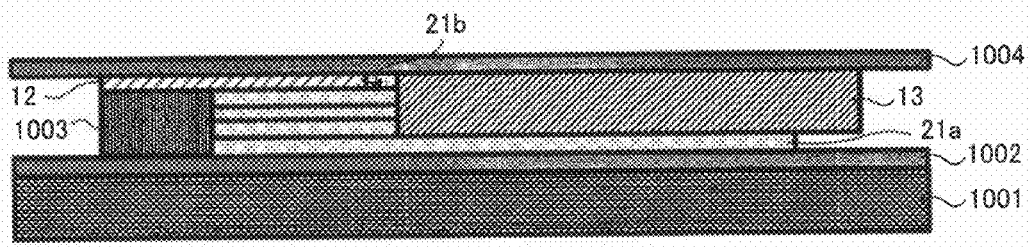
FIG. 9E is a drawing used to explain a variation on the method of producing the circuit board according to the embodiment of the present invention.
Figure 9F:
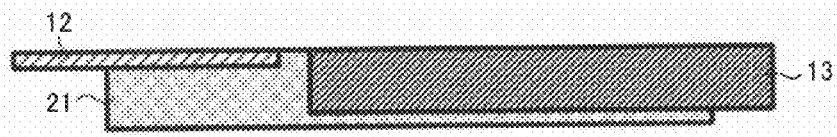
FIG. 9F is a drawing used to explain a variation on the method of producing the circuit board according to the embodiment of the present invention.

Next, as shown in FIG. 9E, separation paper 1004 is deposited from above and hot pressing is accomplished. Following this, the lower jig 1001 and the separation papers 1002 and 1004 are removed, as shown in FIG. 9F.

Figure 9G:
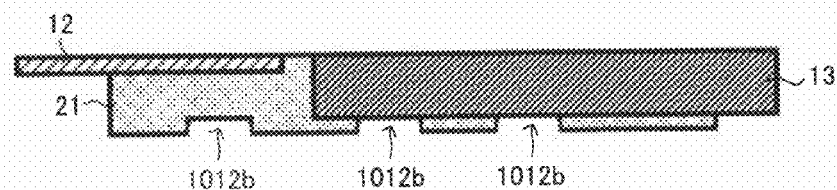
FIG. 9G is a drawing used to explain a variation on the method of producing the circuit board according to the embodiment of the present invention.
Figure 9H:
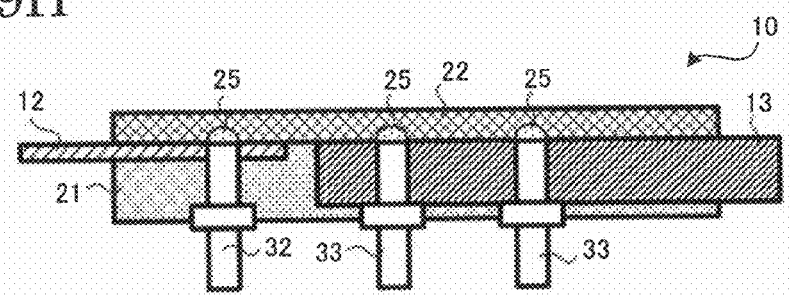
FIG. 9H is a drawing used to explain a variation on the method of producing the circuit board according to the embodiment of the present invention.

Next, as shown in FIG. 9G, an opening 1012b for contacting the flanges 500 (FIG. 2A) of the first through third conductive posts 31 to 33 is formed through laser irradiation or a countersinking process. Furthermore, the holes 31a, 32a and 33a (noted in FIG. 2D) for inserting the conductive posts are formed. Following this, after the above-described conductive post insertion process, the circuit board 10 is completed, as shown in FIG. 9H.

Figure 10A:
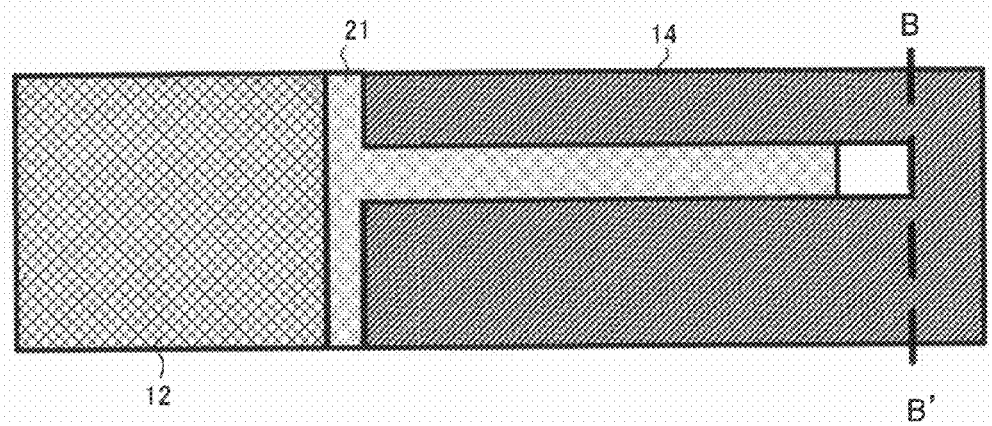
FIG. 10A is a drawing used to explain a variation on the method of forming the first metal plate and the third metal plate according to the embodiment of the present invention.
Figure 10B:
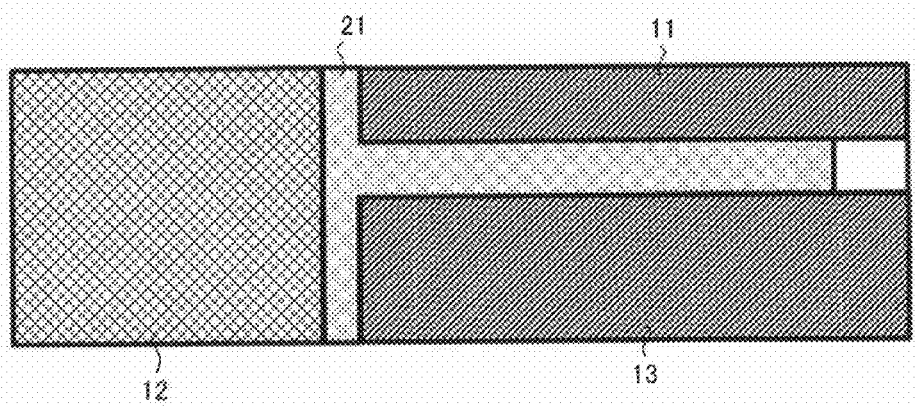
FIG. 10B is a drawing used to explain a variation on the method of forming the first metal plate and the third metal plate according to the embodiment of the present invention.

The first metal plate 11 and the third metal plate 13 may be formed with a method like the one shown in FIGS. 10A and 10B. FIGS. 10A and 10B respectively show cross-sections corresponding to the cross-section shown in FIG. 3A.

As shown in FIG. 10A, with this method, after the first metal plate 11 and the third metal plate 13 are anchored with resin using the integrally formed metal plate 14, by cutting the metal plate 14 at the cross-section at line B-B' in FIG. 10A, the first metal plate 11 and the third metal plate 13 are mutually separated, as shown in FIG. 10B. Because the strength of the metal plate 14 is high prior to separation, this method is effective in increasing strength during manufacturing.

Having described and illustrated the principles of this application by reference to one (or more) preferred embodiment(s), it should be apparent that the preferred embodiment(s) may be modified in arrangement and detail without departing from the principles disclosed herein and that it is intended that the application be construed as including all such modifications and variations insofar as they come within the spirit and scope of the subject matter disclosed herein.

What is claimed is:

1. A circuit board for mounting a semiconductor device comprising:
    a plurality of metal plates comprising a first metal plate, a second metal plate and a third metal plate;
    a plurality of conductive posts positioned to be connected to a semiconductor device and comprising a first conductive post connected to the first metal plate, a second conductive post connected to the second metal plate, and a third conductive post connected to the third metal plate; and
    an insulating resin structure anchoring the first metal plate, the second metal plate and the third metal plate such that at least two of the first metal plate, the second metal plate and the third metal plate are insulated from each other,
    wherein the first conductive post is positioned to be connected to a first electrode of the semiconductor device, the second conductive post is positioned to be connected to a second electrode of the semiconductor device, the third conductive post is positioned to be connected to a third electrode of the semiconductor device, and the insulating resin structure is covering the first metal plate, the second metal plate and the third metal plate such that at least one of the first metal plate, the second metal plate and the third metal plate has an end portion projecting from the insulating resin structure.

2. The circuit board according to claim 1, wherein the insulating resin structure includes an anchoring resin structure connecting the first, second and third metal plates together through the anchoring resin structure.

3. The circuit board according to claim 1, wherein the insulating resin structure includes an anchoring resin structure connecting the first, second and third metal plates and a reinforcing resin layer covering the anchoring resin structure and a surface of the first metal plate, a surface of the second metal plate and a surface of the third metal plate such that the reinforcing resin layer is anchoring the anchoring resin structure, the first metal plate, the second metal plate and the third metal plate together.

4. The circuit board according to claim 1, wherein at least one pair out of the first metal plate and the first conductive post, the second metal plate and the second conductive post and the third metal plate, the third conductive post is made of substantially similar materials as each other.

5. The circuit board according to claim 1, wherein at least one of the first metal plate, the second metal plate, and the third metal plate has a through hole in which a respective one of the first conductive post, the second conductive post, and the third conductive post is mutually connected.

6. The circuit board according to claim 1, wherein at least one of the first metal plate, the second metal plate and the third metal plate is a flexible metal plate.

7. The circuit board according to claim 1, wherein the first metal plate, the second metal plate and the third metal plate are made of Cu, a Cu—Cr alloy, a Cu—Ni—Si alloy or a Cu—Fe alloy.

8. The circuit board according to claim 7, wherein the first metal plate, the second metal plate and the third metal plate are made of Cu.

9. The circuit board according to claim 2, wherein the anchoring resin structure is made of a bismaleimide triazine resin, an epoxy resin, a phenol resin, a polyimide resin, a polyamide resin or a silicon resin.

10. The circuit board according to claim 3, wherein the reinforcing resin layer is made of a bismaleimide triazine resin, an epoxy resin, a phenol resin, a polyimide resin, a polyamide resin or a silicon resin.

11. The circuit board according to claim 1, wherein at least one of the first conductive post, the second conductive post and the third conductive post is connected to a respective one of the first metal plate, the second metal plate and the third metal plate by solder.

12. The circuit board according to claim 11, wherein the solder is an Sn—Cu type solder, a Bi—Sn type, an Sn—Pb type solder, a Zn—Al type or an Sn—Zn type solder.

13. The circuit board according to claim 1, wherein the first conductive post, the second conductive post and the third conductive post are made of Cu, a Cu—Cr alloy, a Cu—Ni—Si alloy, a Cu—Fe alloy, Al or an Al alloy.

14. The circuit board according to claim 1, wherein at least one of the first conductive post, the second conductive post and the third conductive post has an uneven surface formed on at least one of a flange portion, a head portion and a foot portion of the at least one of the first conductive post, the second conductive post and the third conductive post.

15. The circuit board according to claim 1, wherein at least one of the first conductive post, the second conductive post and the third conductive post has a notch formed in at least one of a head portion or a foot portion of the at least one of the first conductive post, the second conductive post and the third conductive post.

16. The circuit board according to claim 1, wherein the first conductive post, the second conductive post and the third conductive post have different thicknesses from each other.

17. A semiconductor module, comprising:
the circuit board according to claim 1; and
a semiconductor device having a first electrode, a second electrode and a third electrode,
wherein at least one of the first metal plate, the second metal plate and the third metal plate is positioned such that the at least one of the first metal plate, the second metal plate and the third metal plate faces the semiconductor device and is electrically connected to the semiconductor device via a respective one of the first conductive post, the second conductive post and the third conductive post.

18. The semiconductor module according to claim 17, wherein at least one of the first conductive post, the second conductive post and the third conductive post is electrically connected to the semiconductor device via solder.

19. The semiconductor module according to claim 17, wherein the insulating resin structure includes an anchoring resin structure connecting the first, second and third metal plates together through the anchoring resin structure.

20. The semiconductor module according to claim 17, wherein the insulating resin structure includes an anchoring resin structure connecting the first, second and third metal plates and a reinforcing resin layer covering the anchoring resin structure and a surface of the first metal plate, a surface of the second metal plate and a surface of the third metal plate such that the reinforcing resin layer is anchoring the anchoring resin structure, the first metal plate, the second metal plate and the third metal plate together.

21. The semiconductor module according to claim 17, wherein at least one pair out of the first metal plate and the first conductive post, the second metal plate and the second conductive post and the third metal plate and the third conductive post is made of substantially similar materials as each other.

22. The semiconductor module according to claim 17, wherein at least one of the first metal plate, the second metal plate, and the third metal plate has a through hole in which a respective one of the first conductive post, the second conductive post, and the third conductive post is mutually connected.

23. The semiconductor module according to claim 17, at least one of the first metal plate, the second metal plate and the third metal plate is a flexible metal plate.

24. The semiconductor module according to claim 17, wherein the first metal plate, the second metal plate and the third metal plate are made of Cu, a Cu—Cr alloy, a Cu—Ni—Si alloy or a Cu—Fe alloy.

25. The semiconductor module according to claim 24, wherein the first metal plate, the second metal plate and the third metal plate are made of Cu.

26. The semiconductor module according to claim 19, wherein the anchoring resin structure is made of a bismaleimide triazine resin, an epoxy resin, a phenol resin, a polyimide resin, a polyamide resin or a silicon resin.

27. The semiconductor module according to claim 20, wherein the reinforcing resin structure is made of a bismaleimide triazine resin, an epoxy resin, a phenol resin, a polyimide resin, a polyamide resin or a silicon resin.

28. The semiconductor module according to claim 17, wherein at least one of the first conductive post, the second conductive post and the third conductive post is connected to a respective one of the first metal plate, the second metal plate and the third metal plate by solder.

29. The semiconductor module according to claim 28, wherein the solder is an Sn—Cu type solder, a Bi—Sn type solder, an Sn—Pb type solder, a Zn—Al type solder or an Sn—Zn type solder.

30. The semiconductor module according to claim 17, wherein the first conductive post, the second conductive post and the third conductive post are made of Cu, a Cu—Cr alloy, a Cu—Ni—Si alloy, a Cu—Fe alloy, Al or an Al alloy.

31. The semiconductor module according to claim 17, wherein at least one of the first conductive post, the second conductive post and the third conductive post has an uneven surface formed on at least one of a flange portion, a head portion and a foot portion of the at least one of the first conductive post, the second conductive post and the third conductive post.

32. The semiconductor module according to claim 17, wherein at least one of the first conductive post, the second conductive post and the third conductive post has a notch formed in at least one of a head portion or a foot portion of the at least one of the first conductive post, the second conductive post and the third conductive post.

33. The semiconductor module according to claim 17, wherein the first conductive post, the second conductive post and the third conductive post have different thicknesses from each other.

* * * * *